(12) United States Patent
Sobel et al.

(10) Patent No.: US 7,178,345 B2
(45) Date of Patent: Feb. 20, 2007

(54) STACKED-PLATE GAS-EXPANSION COOLER ASSEMBLY, FABRICATION METHOD, AND USE

(75) Inventors: Larry D. Sobel, Tucson, AZ (US); Jeff Capara, Tucson, AZ (US); Justin C. Jenia, Tucson, AZ (US)

(73) Assignee: Ratheon Company, Waltham, MA (US)

( * ) Notice: Subject to any disclaimer, the term of this patent is extended or adjusted under 35 U.S.C. 154(b) by 749 days.

(21) Appl. No.: 10/650,094

(22) Filed: Aug. 26, 2003

(65) Prior Publication Data

US 2006/0180752 A1    Aug. 17, 2006

Related U.S. Application Data

(63) Continuation of application No. 09/952,513, filed on Sep. 7, 2001, now Pat. No. 6,621,071.

(51) Int. Cl.
*F25B 19/02*    (2006.01)
*F28D 7/10*    (2006.01)
*F28F 3/00*    (2006.01)

(52) U.S. Cl. .................. 62/51.2; 165/154; 165/166
(58) Field of Classification Search ............... 62/51.2; 165/154, 155, 156, 166
See application file for complete search history.

(56) References Cited

U.S. PATENT DOCUMENTS

| | | | |
|---|---|---|---|
| 4,386,505 A | 6/1983 | Little | |
| 4,392,362 A | 7/1983 | Little | |
| 4,431,050 A * | 2/1984 | Martin | 165/166 |
| 4,438,909 A * | 3/1984 | Matsumoto | 267/64.26 |
| 4,489,570 A | 12/1984 | Little | |
| 4,624,305 A * | 11/1986 | Rojey | 165/165 |
| 4,682,032 A | 7/1987 | Barrett | |
| 4,747,450 A | 5/1988 | Ikegame et al. | |
| 5,101,894 A * | 4/1992 | Hendricks | 165/164 |
| 5,590,538 A * | 1/1997 | Hsu et al. | 62/51.2 |
| 5,596,228 A | 1/1997 | Anderton | |
| 5,758,505 A * | 6/1998 | Dobak et al. | 62/6 |
| 5,787,977 A * | 8/1998 | Yuasa et al. | 165/284 |
| 6,054,676 A | 4/2000 | Wall et al. | |
| 6,127,203 A | 10/2000 | Wan et al. | |

(Continued)

*Primary Examiner*—William C. Doerrler
(74) *Attorney, Agent, or Firm*—Thomas J. Finn; Leonard A. Aikov; Karl A. Vick (57) ABSTRACT

A gas-expansion cooler assembly has an expansion structure with an expansion orifice and an expansion reservoir in fluid-flow communication with an expansion-orifice outlet. A heat exchanger has a heat-exchanger inlet, and a heat-exchanger outlet in fluid-flow communication with the expansion-orifice inlet. The heat exchanger includes at least two heat-exchanger plates stacked in a facing relationship along an assembly axis. Each heat-exchanger plate includes an in-plane channel lying substantially in a plane perpendicular to the assembly axis. The in-plane channels of the adjacent heat-exchanger plates are in fluid-flow communication with each other and with the expansion-orifice inlet to form a continuous high-pressure fluid-flow path from the heat-exchanger inlet to the expansion-orifice inlet. The heat exchanger further includes an axial channel extending parallel to the assembly axis. The axial channels in the adjacent heat-exchanger plates are in fluid-flow communication with each other and with the expansion reservoir to form a continuous exhaust fluid-flow path from the expansion reservoir to an exhaust port.

24 Claims, 4 Drawing Sheets

U.S. PATENT DOCUMENTS

| | | | |
|---|---|---|---|
| 6,151,901 A | * 11/2000 | Dobak et al. | 62/51.2 |
| 6,252,221 B1 | 6/2001 | Kaneko et al. | |
| 6,446,712 B1 | * 9/2002 | Wu et al. | 165/167 |
| 2001/0021847 A1 | 9/2001 | Abboud et al. | |
| 2001/0030040 A1 | * 10/2001 | Xiao | 165/154 |

* cited by examiner

FIG.4

STACKED-PLATE GAS-EXPANSION COOLER ASSEMBLY, FABRICATION METHOD, AND USE

This application is a continuation in part of application Ser. No. 09/952,513, filed Sep. 7, 2001 now U.S. Pat. No. 6,621,071, for which priority is claimed and whose disclosure is incorporated by reference.

This invention relates a to gas-expansion cooler assembly and, more particularly, to the gas-expansion cooler assembly that rapidly cools an electronic system when placed into service.

BACKGROUND OF THE INVENTION

In one type of imaging infrared sensor system, a microelectronic light sensor is deposited on a substrate. The substrate is supported on a cold-finger pedestal. The other end of the pedestal is cooled by a gas-expansion cooler such as a Joule-Thomson cooler. The light sensor achieves its most efficient operation and highest signal-to-noise ratio when cooled to a cryogenic temperature such as liquid nitrogen temperature or lower. The light sensor and the cold-finger pedestal are placed inside a vacuum enclosure which has a window facing the light sensor and through which light is admitted. The vacuum enclosure insulates the light sensor and cold-finger pedestal, and protects the light sensor against physical damage.

When the sensor system is to be operated, compressed gas is passed through the gas-expansion cooler. Upon expansion through an orifice, the gas cools and absorbs heat to cool the cold-finger pedestal and thence the light sensor to a required temperature, typically a cryogenic temperature. Upon reaching the cryogenic operating temperature, the light sensor is activated. The output signal of the light sensor is provided to a display or to a computer for further processing.

Microelectronic sensor systems of this type are well known and widely used. One of their drawbacks, however, is that the time required to cool the light sensor from room temperature to its cryogenic operating temperature may be on the order of one minute. For some applications, that cooldown time may be acceptable, but for other applications, such as military applications, it may be unacceptably long. Additionally, the light sensor is cantilever mounted on the end of the cold-finger pedestal, increasing the susceptibility of the signals to degradation due to vibration. There is also the desire to decrease the size and weight of the sensor system as much as possible.

Various techniques have been employed to increase the cooldown rate and to reduce the size and weight of the sensor system. However, there remains a need for an improved approach to cryogenically cooled sensor systems that overcomes the cooldown rate, size, and weight shortcomings of prior coolers, while still providing the required low operating temperature and satisfactory performance of the light sensor.

This cooling problem has been posed in relation to sensors, but it is equally applicable to some other types of microelectronic systems that generate large amounts of heat during service, such as high-performance computer chips and microelectronic amplifiers. It may not be necessary to cool these microelectronic systems to cryogenic temperatures, but accelerated heat removal may be required to maintain the microelectronic systems within operating temperature limits.

Thus, there is a need for an improved approach to cooling a variety of microelectronic and other systems, some to cryogenic temperatures. The present invention fulfills this need, and further provides related advantages.

SUMMARY OF THE INVENTION

The present approach provides a gas-expansion cooler assembly which rapidly removes heat from the structure to be cooled, such as a microelectronic device. The cooling may be to a cryogenic temperature. The cooler may be integral with the microelectronic system rather than being separate from it as in conventional cold-finger pedestal designs. There is a shorter path from the microelectronic system to the cold sink and fewer interfaces between the microelectronic system and the cold sink than in conventional coolers (and in some cases no interfaces), with less thermal impedance as a result. The microelectronic system or other device is therefore cooled from a higher temperature to its service temperature, which may be a cryogenic service temperature, more rapidly than in conventional designs. The size and weight of the microelectronic system are reduced as compared with conventional Joule-Thomson coolers. In the case where the microelectronic system is a light-sensor system, the performance of the sensor system is improved because the light sensor is not cantilevered at the end of an arm, so that there is less susceptibility to vibration.

In accordance with the invention, a gas-expansion cooler assembly has an assembly axis and comprises an expansion plate having an expansion orifice therein. The expansion orifice has an expansion-orifice inlet and an expansion-orifice outlet, and an expansion-plate axial channel extending through the expansion plate parallel to the assembly axis. The gas-expansion cooler assembly further includes an end plate in facing relation to a first side of the expansion plate. The expansion plate and the end plate together define an expansion reservoir in fluid-flow communication with the expansion-orifice outlet and in fluid-flow communication with the expansion-plate axial channel. A heat exchanger in facing relation to a second side of the expansion plate has a heat-exchanger inlet, and a heat-exchanger outlet in fluid-flow communication with the expansion orifice inlet. The heat exchanger comprises at least two heat-exchanger plates stacked in a facing relationship along the assembly axis. The heat-exchanger plates are preferably made of silicon.

Each heat-exchanger plate includes an in-plane channel lying substantially in a plane perpendicular to the assembly axis. The in-plane channels in two adjacent heat-exchanger plates are in fluid-flow communication with each other. An expansion-end heat-exchanger plate adjacent to the expansion plate has the in-plane channel in fluid-flow communication with the expansion-orifice inlet. An inlet-end heat-exchanger plate remote from the expansion plate has the in-plane channel in fluid-flow communication with the heat-exchanger inlet. The in-plane channels of the heat-exchanger plates form a continuous high-pressure fluid-flow path from the heat-exchanger inlet to the expansion-orifice inlet. Each heat-exchanger plate further includes an axial channel extending parallel to the assembly axis. The respective axial channels in two adjacent heat-exchanger plates are in fluid-flow communication with each other. The expansion-end heat-exchanger plate has the axial channel in fluid-flow communication with the expansion-plate axial channel. The expansion reservoir and the axial channels in the expansion plate and the heat-exchanger plates form a continuous exhaust fluid-flow path from the expansion-orifice outlet to an exhaust port.

The in-plane channel is a preferably a spiral, although it may be of other shapes such as a serpentine. The axial channel is preferably straight. In most cases, there is exactly one in-plane channel in each heat-exchanger plate, and there are a plurality of axial channels in each heat-exchanger plate.

Preferably, all of the heat-exchanger plates are substantially identical in construction to facilitate manufacturing and assembly.

There is desirably an insulator-seal plate between each of the heat-exchanger plates and between the expansion-end heat-exchanger plate and the expansion plate. Preferably, all of the insulator-seal plates are substantially identical in construction. The insulator-seal plates are preferably made of a nonmetallic, organic material such as polytetrafluoroethylene.

There may optionally be provided an anti-plugging structure that prevents plugging of the expansion orifice by solid matter.

In another embodiment, a gas-expansion cooler assembly has an assembly axis and comprises an expansion structure having an expansion orifice with an expansion-orifice inlet and an expansion-orifice outlet, and an expansion reservoir in fluid-flow communication with the expansion-orifice outlet. A heat exchanger has a heat-exchanger inlet, and a heat-exchanger outlet in fluid-flow communication with the expansion-orifice inlet. The heat exchanger comprises at least two heat-exchanger plates stacked in a facing relationship along the assembly axis. Each heat-exchanger plate includes an in-plane channel lying substantially in a plane perpendicular to the assembly axis. The in-plane channels of the heat-exchanger plates are in fluid-flow communication with each other and with the expansion-orifice inlet to form a continuous high-pressure fluid-flow path from the heat-exchanger inlet to the expansion-orifice inlet. Each heat-exchanger plate further includes an axial channel extending parallel to the assembly axis. The axial channels in the heat-exchanger plates are in fluid-flow communication with the respective axial channels in the adjacent heat-exchanger plates and with the expansion reservoir to form a continuous exhaust fluid-flow path from the expansion reservoir to an exhaust port. Other compatible features may be used in conjunction with this embodiment.

A method for fabricating a gas-expansion cooler assembly comprises the step of preparing an expansion plate having an expansion orifice therein, wherein the expansion orifice has an expansion-orifice inlet and an expansion-orifice outlet, and an expansion-plate axial channel extending through the expansion plate parallel to the assembly axis. An end plate is prepared, wherein the expansion plate and the end plate together define an expansion reservoir in fluid-flow communication with the expansion-orifice outlet and in fluid-flow communication with the expansion-plate axial channel. The method further includes preparing a heat exchanger having a heat-exchanger inlet, and a heat-exchanger outlet in fluid-flow communication with the expansion orifice inlet. The heat exchanger comprises at least two heat-exchanger plates stacked in a facing relationship along the assembly axis. Each heat-exchanger plate includes an in-plane channel lying substantially in a plane perpendicular to the assembly axis. Preferably, the in-plane channel is laser micromachined into at least one of the heat-exchanger plates. The in-plane channels in two adjacent heat-exchanger plates are in fluid-flow communication with each other. An expansion-end heat-exchanger plate adjacent to the expansion plate has the in-plane channel in fluid-flow communication with the expansion-orifice inlet. An inlet-end heat-exchanger plate remote from the expansion plate has the in-plane channel in fluid-flow communication with the heat-exchanger inlet. The in-plane channels of the heat-exchanger plates form a continuous high-pressure fluid-flow path from the heat-exchanger inlet to the expansion-orifice inlet.

Each heat exchanger plate further includes an axial channel extending parallel to the assembly axis. The respective axial channels in two adjacent heat-exchanger plates are in fluid-flow communication with each other. The expansion-end heat-exchanger plate has the axial channel in fluid-flow communication with the expansion-plate axial channel. The expansion reservoir and the axial channels in the expansion plates and the heat-exchanger plates form a continuous exhaust fluid-flow path from the expansion-orifice outlet to an exhaust port. The gas-expansion cooler assembly is assembled by assembling the end plate in facing relation to a first side of the expansion plate, and assembling the heat exchanger in facing relation to a second side of the expansion plate. Other compatible features may be used in conjunction with this embodiment.

The present approach provides the gas-expansion cooler assembly that cools the cooled device to reduced temperatures, including down to cryogenic temperatures as necessary. The heat exchanger pre-cools the pressurized gas that is to be expanded through the expansion orifice. The pressurized gas flows through the heat-exchanger plates in the in-plane channel, and then to the next one of the heat-exchanger plates, where it again flows in the in-plane channel. In the preferred embodiment where the in-plane channels are spirals, the pressurized gas flows spirally inwardly in a first heat-exchanger plate, spirally outwardly in the next heat-exchanger plate, spirally inwardly in the next heat-exchanger plate, and so on. After the pressurized gas expands through the expansion orifice and into the expansion reservoir, absorbing heat from the device being cooled, it flows out through the axial channels that are closely adjacent to the in-plane channels to pre-cool the incoming pressurized gas in the in-plane channels. The heat exchanger thereby functions as a hybrid counter-flow, cross-flow heat exchanger for the incoming pressurized gas.

A virtue of the present approach is that additional cooling power may be added by adding more heat-exchanger plates to the stack. The additional plates allow more gas to be pre-cooled, leading to an ability to absorb greater heat from the cooled device.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
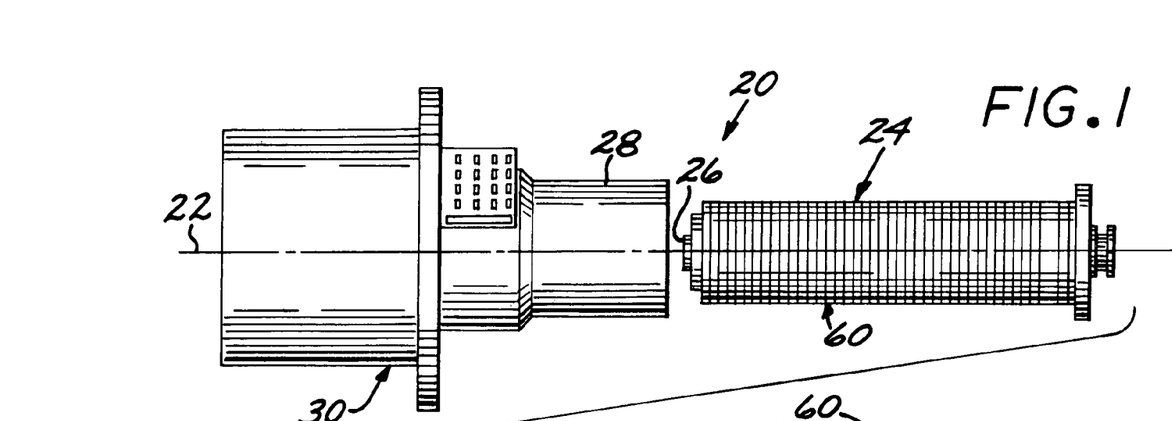
FIG. 1 is a partially exploded view of a gas-expansion cooler assembly.

FIG. 1 depicts in partially exploded view a gas-expansion cooler assembly 20 having an assembly axis 22. The gas-expansion cooler assembly 20 includes a gas expansion cooler 24, and a cooled device 26 mounted thereto. The gas-expansion cooler 24 and cooled device 26 are received in a fitting 28 of a vacuum dewar 30.

Figure 2:
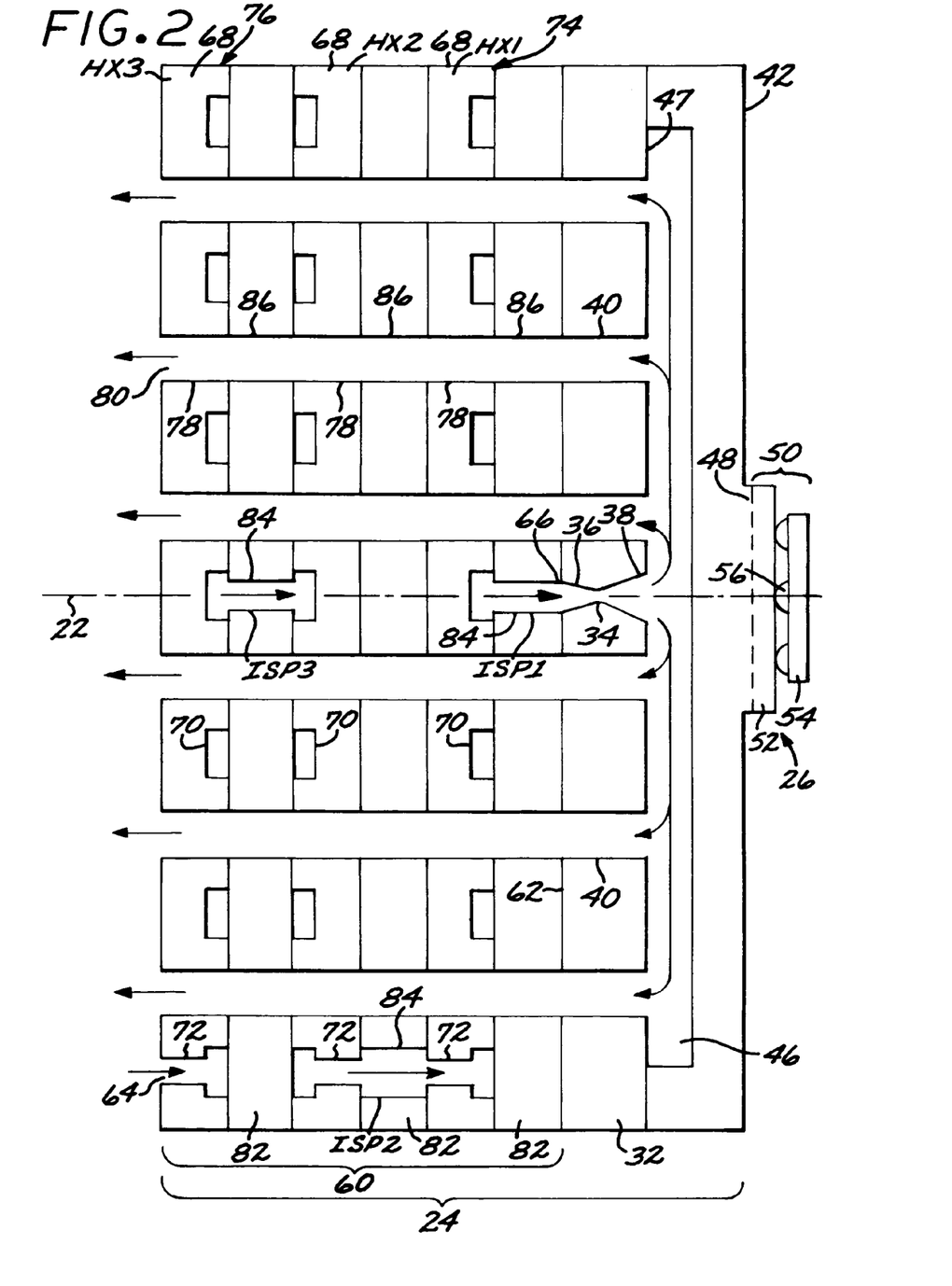
FIG. 2 is a schematic sectional view of a portion of a first embodiment of the gas-expansion cooler assembly.
Figure 3:
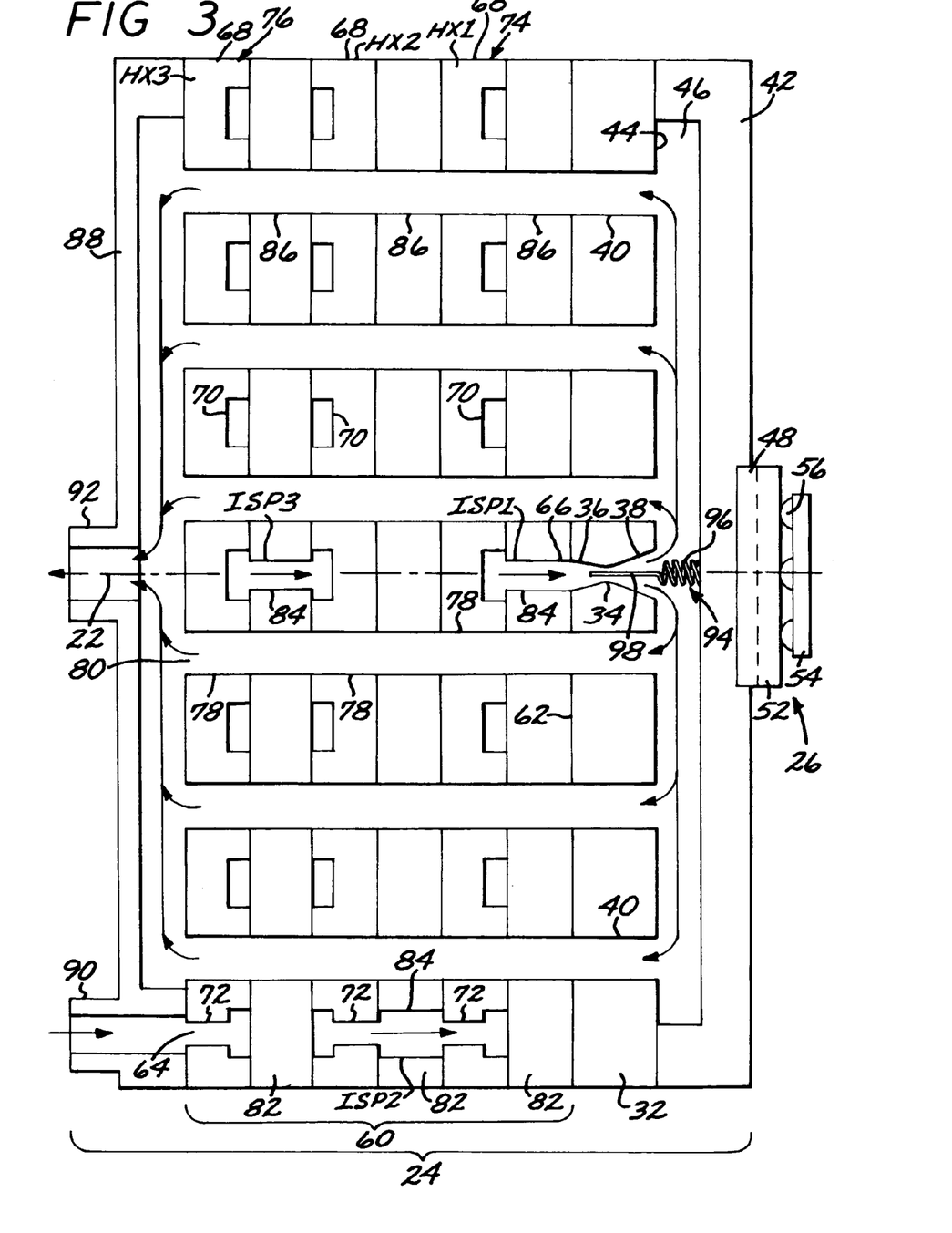
FIG. 3 is a schematic sectional view of a portion of a second embodiment of the gas-expansion cooler assembly.

As seen in FIGS. 2 and 3, a preferred form of the gas-expansion cooler 24 is made of a series of plates having gas-flow channels therein. The embodiments of FIGS. 2 and 3 are similar, and the same description is applicable to both figures except as will be discussed subsequently. The plates that form the gas-expansion cooler 24 are all substantially flat, so that they may be stacked together. The plates all preferably have a cylindrical periphery, so that they form a cylindrical structure as shown in FIG. 1 and in FIGS. 4–5.

The gas-expansion cooler 24 includes an expansion plate 32 having an expansion orifice 34 therein. The expansion orifice 34 has an expansion-orifice inlet 36 and an expansion-orifice outlet 38. The expansion orifice 34 has reduced cross-sectional area as compared with the cross-sectional areas of the expansion-orifice inlet 36 and the expansion-orifice outlet 38. Additionally, there is at least one, and preferably a plurality of, expansion-plate axial channels 40 extending through the expansion plate 32 parallel to the assembly axis 22.

An end plate 42 is in facing relation to a first side 44 of the expansion plate 32. The expansion plate 32 and the end plate 42 together define an expansion reservoir 44 in fluid-flow communication with the expansion-orifice outlet 38 and in fluid-flow communication with the expansion-plate axial channels 40. (As used herein, "fluid" includes both gases and liquids, but not solids.) In the illustrated embodiment, the expansion reservoir 46 is defined by a recess in the end plate 42, but it could be defined by a recess in the expansion plate 32 so that the end plate 42 is flat on its surface facing the expansion plate 32, or a combination of recesses.

The cooled device 26 is in thermal contact with the end plate 42. If the end plate 42 is made of a suitable material, such as silicon, the cooled device 26 may be formed in and fabricated integrally with the end plate 42, as in the embodiment of FIG. 2. The cooled device 26 may instead be fabricated entirely separately from the end plate 42 as a stand-alone device, and then affixed to the end plate 42, as in the embodiment of FIG. 3.

In the embodiments of most interest, the cooled device 26 is a sensor system that senses light. The following discussion will emphasize this light sensor application, but the present approach is equally applicable to other types of cooled devices 26 in which other types of microelectronic devices are used instead of the light sensor, such as computer chips, power converters, amplifiers, other non-optical microcircuits, and other heat-producing or cooled devices. In the preferred light sensor application, the cooled device 26 is cooled to a cryogenic temperature such as liquid nitrogen temperature or below. Where the cooled device 26 includes other types of devices, it may not be necessary to cool the microelectronic device to cryogenic temperature, but instead to some intermediate service temperature within the operating temperature limits of the components of the device.

The cooled device 26 includes a substrate 48 with a microelectronic device 50, here in the form of a light sensor, fabricated on the substrate 48. In the embodiment of FIG. 2, the substrate 48 is part of and integral with the end plate 42. In the embodiment of FIG. 3, the substrate 48 is initially separate from the end plate 42 and is affixed to the end plate 42 during fabrication.

The light-sensor microelectronic device 50 includes a readout integrated circuit (ROIC) 52 deposited onto the substrate 48. The ROIC 52 is typically formed of a silicon-based technology, and the substrate 48 is made of silicon. In other applications, the substrate 48 may be made of other materials such as other semiconductor substrates, ceramics (e.g., aluminum oxide), or metals (e.g., beryllium or aluminum). The microelectronic device 50 further includes a light detector 54 that is mechanically supported on and is electrically interconnected with the ROIC 52, typically by electrically conducting bumps 56 made of a material such as indium. The light detector 54 is ordinarily formed of a technology other than silicon, such as gallium arsenide. The light detector 54 may be fabricated to be sensitive to any selected wavelength or wavelength range of light, such as the ultraviolet, visible, near infrared, mid infrared, or far infrared. Microelectronic devices 50 in the form of light sensors and their fabrication for the various wavelengths of light are known in the art. The cooled device 26 preferably operates in the vacuum dewar 30 to reduce thermal losses and protect the light sensor. In other applications, no vacuum enclosure is employed.

The gas-expansion cooler 24 is of the Joule-Thomson type and functions by expanding a pressurized working gas through the expansion orifice 34. Upon expansion, the working gas cools and absorbs heat from the surroundings, and in particular from the cooled device 26. To achieve efficient operation, the working gas is preferably pre-cooled before it reaches the expansion-orifice inlet 36.

The gas-expansion cooler 24 therefore further includes a heat exchanger 60 lying on the assembly axis 22 and in facing relation to (but not necessarily contacting) a second side 62 of the expansion plate 32. The heat exchanger 60 has a heat-exchanger inlet 64, and a heat-exchanger outlet 66 in fluid-flow communication with the expansion orifice inlet 36.

The heat exchanger 60 includes at least two heat-exchanger plates 68 stacked in a facing relationship along the assembly axis 22. The heat-exchanger plates 68 are in facing relation but do not touch each other in the preferred approach, because there are intermediate insulator-seal plates between each pair of heat-exchanger plates 68, as will be discussed subsequently. The heat-exchanger plates 68 are shown in side sectional view in FIGS. 2–3 and in perspective view in FIG. 5, and one of the heat-exchanger plates 68 is shown in plan view in FIG. 4.

Figure 4:
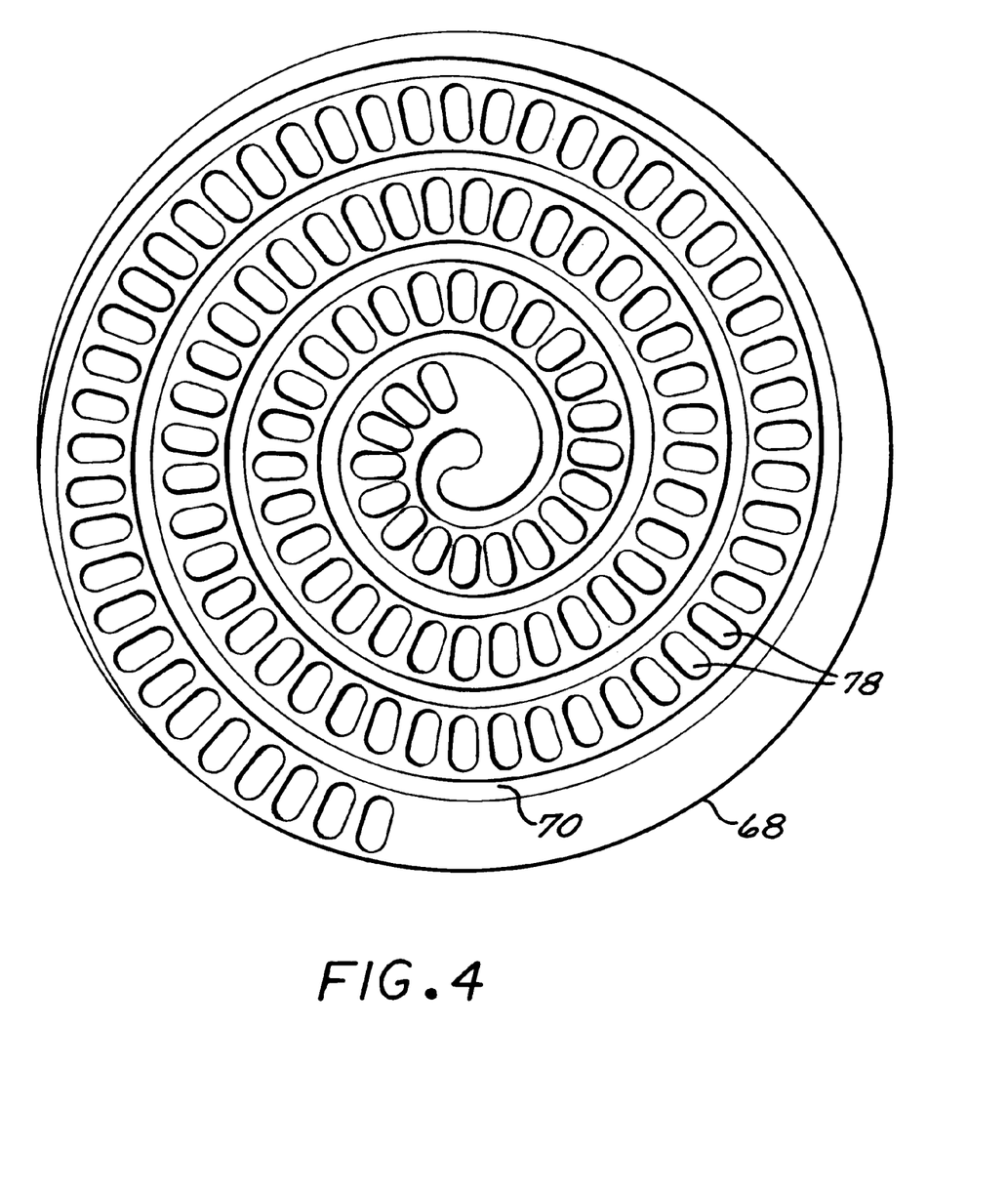
FIG. 4 is a plan view of one of the heat-exchanger plates.

Each heat-exchanger plate 68 includes an in-plane channel 70 lying substantially in a plane perpendicular to the assembly axis 22, which is the plane of the surface of the heat-exchanger plates 68. The in-plane channels 70 in two adjacent heat-exchanger plates 68 are in fluid-flow communication with each other through heat-exchanger-plate via channels 72 that extend parallel to the assembly axis 22. An expansion-end heat-exchanger plate 74 adjacent to the expansion plate 32 has the in-plane channel 70 in fluid-flow communication with the expansion-orifice inlet 36 through one of the heat-exchanger-plate via channels 72. An inlet-end heat-exchanger plate 76 remote from the expansion plate 32 has the in-plane channel 70 in fluid-flow communication with the heat-exchanger inlet 64. The in-plane channels 70 (including their heat-exchanger-plate via channels 72) of the heat-exchanger plates 68 form a continuous high-pressure fluid-flow path from the heat-exchanger inlet 64 to the expansion-orifice inlet 36. In the preferred approach, the in-plane channel 70 of each of the heat-exchanger plates 68 is a spiral from the outer periphery to the centerline (at the assembly axis 22) of the respective heat-exchanger plate 68. There is desirably exactly one in-plane channel 70 in each of the heat-exchanger plates 68.

Each heat-exchanger plate 68 further includes at least one, and preferably a plurality of, axial channels 78 extending parallel to the assembly axis 22. The pattern of these axial channels 78 for an exemplary design is seen in FIG. 4. The axial channels 78 in each two adjacent heat-exchanger plates 68 are aligned with each other in a direction parallel to the assembly axis 22 and are thence in fluid-flow communication with each other. The expansion-end heat-exchanger plate 74 has its axial channels 78 aligned with and in fluid-flow communication with the same pattern of the expansion-plate axial channels 40. The expansion reservoir 46, the expansion-plate axial channels 40, and the heat-exchanger axial channels 78 form continuous exhaust fluid-flow paths extending from the expansion-orifice outlet 38 to an exhaust port 80.

In the preferred design, the heat-exchanger plates 68 are all substantially identical in construction (although alternatingly inverted during assembly). This feature is a substantial manufacturing advantage to reduce manufacturing cost, different-part counts, and complexity.

The heat-exchanger plates 68 and the expansion plate 32 are preferably made of a high-thermal-conductivity, rigid material such as silicon, to aid in the heat transfer from incoming high-pressure gas flowing in the in-plane channels 70 and their via channels 72, to the cold exhaust gas flowing in the axial channels 40 and 78. If the rigid plates 68 and 32 are stacked directly in contact with each other, it is difficult to maintain gas-tight seals of the high-pressure gas flow and the exhaust-gas flow. Additionally, due to the heat-exchanger effect, the incoming high-pressure gas becomes progressively colder as it flows from the heat-exchanger inlet 64 toward the expansion-orifice inlet 36, and conversely the exhaust gas becomes progressively warmer as it flows from the expansion reservoir 46 toward the exhaust port 80. Placement of the plates 68 and 32 in direct contact works against the high-pressure gas becoming as cold as possible when it reaches the expansion-orifice inlet 36 by allowing heat flow parallel to the assembly axis 22 from the expansion-end heat-exchanger plate 74 toward the inlet-end heat-exchanger plate 76.

To alleviate these potential problems, it is preferred to provide an insulator-seal plate 82 between each of the heat-exchanger plates 68 and between the expansion-end heat-exchanger plate 74 and the expansion plate 32. When the plates 68 and 32 were described earlier as being in facing relation, it is with the understanding that the insulator-seal plates 82 may, and preferably do, lie between the pairs of plates 68 and 32. The insulator-seal plates 82 are preferably made of a material that has a relatively low thermal conductivity, is sufficiently deformable to provide the necessary gas-tight seals, and maintains these properties at both room and reduced temperatures. The preferred material of construction of the insulator-seal plates 82 is an organic material such as polytetrafluoroethylene. The insulator-seal plates 82 have appropriately positioned insulator-seal-plate high-pressure vias 84 therethrough aligned with the appropriate via channels 72, and appropriately positioned insulator-seal-plate axial channels 86 therethrough aligned with the respective axial channels 40 and 78. Preferably, the insulator-seal plates 82 are all of substantially identical construction, facilitating the manufacturing process.

Figure 5:
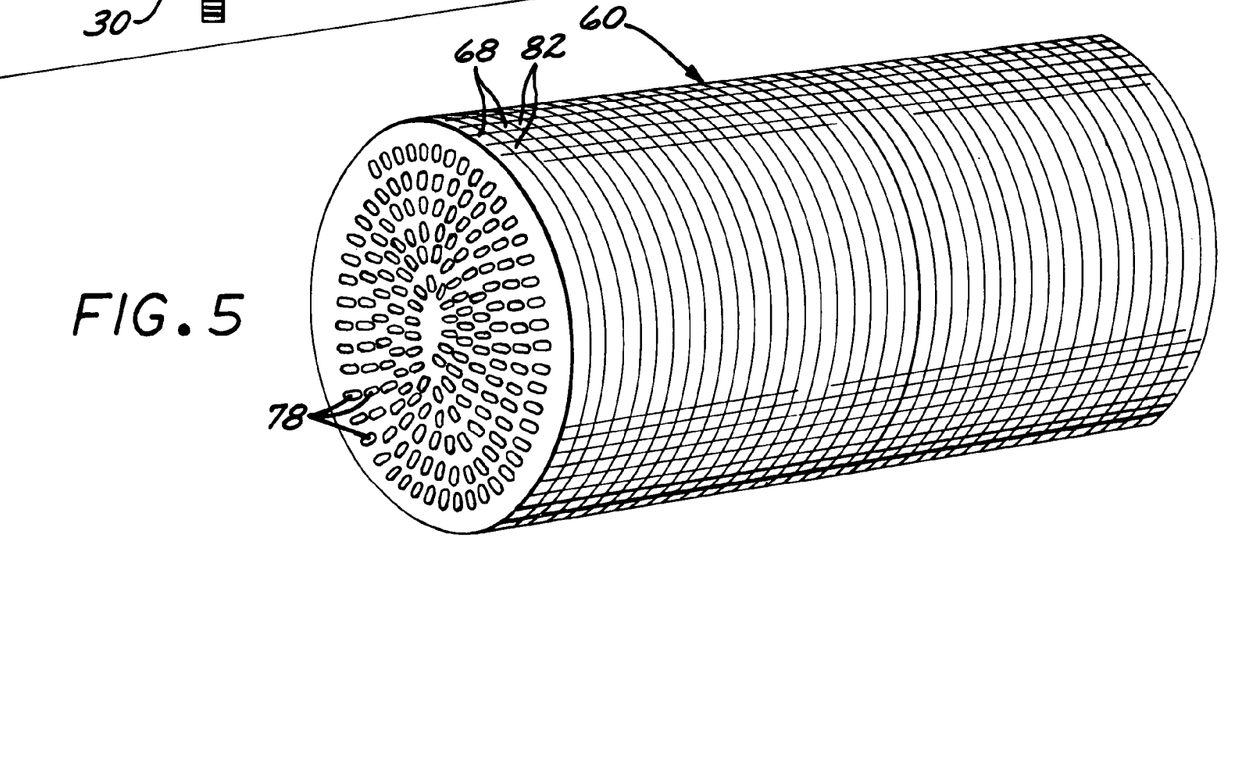
FIG. 5 is a perspective view of the assembled heat exchanger.

FIG. 5 illustrates the completed heat exchanger 60. Although FIGS. 2–3 are drawn with only three of the heat-exchanger plates 68 for simplicity, there are typically many more of the heat-exchanger plates 68 in the operating embodiment of the heat exchanger 60. One important advantage of the present approach is that the cooling power of the heat exchanger 60 may be readily increased as necessary by adding more of the heat-exchanger plates 68 and the corresponding insulator-seal plates 82 between the pairs of heat-exchanger plates 68. If the heat exchanger 60 has too much cooling power, the cooling power, size and weight may be reduced by removing pairs of plates 68 and 82. The plates 68, 82, 32, and 42 are held together by any operable approach, such as an adhesive that bonds the plates together, or an external mechanical clamp.

The embodiment illustrated in FIG. 3 has two additional features not shown in FIG. 2, but which may be used with the embodiment of FIG. 2. One such feature is a compartmented manifold 88 sealed to the inlet-end heat-exchanger plate 76. The manifold 88 provides a convenient external high-pressure connection 90 to the heat-exchanger inlet 64, and a convenient external exhaust connection 92 to the exhaust ports 80.

A further feature of the embodiment of FIG. 3 is an anti-plugging structure 94 that inhibits plugging of the expansion orifice 34 by solid matter that may find its way into the high-pressure working gas or that otherwise may form in the expansion orifice 34. The preferred anti-plugging structure 94 is a spring coil 96 of fine-diameter wire affixed to the interior wall of the end plate 42 and having an uncoiled length of free end 98 extending into the expansion orifice 34. The expansion orifice 34 is sized to account for the presence of the free end 98 when the anti-plugging structure 94 is used. When the high-pressure working gas passes through the expansion orifice 34, the action of the working gas against the free end 98 causes the spring coil 96 to vibrate slightly. The vibrating action of the spring coil 96 on the free end 98 inhibits the plugging of the expansion orifice 34 by any solid matter.

The gas flow path through the gas-expansion cooler 24 is indicated by a series of arrows in FIGS. 2 and 3. The pressurized working gas, such as dry air, argon, nitrogen, or krypton is introduced into the heat-exchanger inlet 64, through the high-pressure connection 90 in the embodiment of FIG. 3, typically at a pressure of from about 6000 to about 8000 pounds per square produced by an external compressor (not shown). In the heat-exchanger plate 68 indicated as HX3, the pressurized working gas starts at the periphery and spirals inwardly in the in-plane channel 70. Upon reaching the radial center of HX3, the working gas flows along the assembly axis 22, through the insulator-seal-plate via channel 84 indicated as ISP3, and into the heat-exchanger plate 68 indicated as HX2. The working gas then spirals outwardly in the in-plane channel 70. Upon reaching the near-periphery of HX2, the working gas flows parallel to the assembly axis 22, through the insulator-seal-plate via channel 84 indicated as ISP2, and into the heat-exchanger plate 68 indicated as HX1. The pressurized working gas spirals inwardly in the in-plane channel 70. Upon reaching the radial center of HX1 at the axis 22, the working gas flows along the assembly axis 22, through the insulator-seal-plate via channel 84 indicated as ISP1, and into the expansion-orifice inlet 36. This gas flow path provides the continuous high-pressure fluid-flow path from the heat-exchanger inlet 64 to the expansion-orifice inlet 36.

The pressurized working gas expands through the expansion-orifice 34 and absorbs heat from the cooled device 26 by the Joule-Thomson effect. The reduced-pressure working gas, now termed exhaust gas, flows through the expansion reservoir 46 and into the axial channels defined by elements 40, 78, and 86. The exhaust gas flows through the axial channels 40, 78, and 86 to the heat-exchanger outlet 66, and thence through the exhaust connection 92 in the embodiment of FIG. 3. The axial channels 40, 78, and 86 thus form the continuous exhaust fluid-flow path from the expansion-orifice outlet 38 to the exhaust port, which may be the heat-exchanger outlet 66 or the exhaust connection 92.

As the warm pressurized working gas introduced through the heat-exchanger inlet 64 flows in its path to the expansion-orifice inlet 36, it is cooled by the flow of the exhaust gas in the heat exchanger 60. If it is desired to cool the warm pressurized working gas further, more heat-exchanger plates 68 may be added to the stack as needed.

The in-plane channels 70 and the via channels 72 may be prepared in the heat-exchanger plates 68 by any operable approach. Preferably, the in-plane channels 70 and the via channels 72 are micromachined into the substrate by laser micromachining to accomplish the microforming. Laser micromachining is a technique that is known in the art for other applications. In a preferred approach for micromachining silicon, the preferred material for the heat-exchanger plate 68, the area to be micromachined is heated with a finely focused laser beam, such as a laser beam from a 15–20 watt gallium arsenide laser. Chlorine gas is passed over the heated area, so that the chlorine chemically combines with the silicon in the heated area to form silicon chloride gas that is removed. Alternatively but less desirably, the in-plane channels 70 and the via channels 72 may be formed into the heat-exchanger plates 68 as it is initially grown or deposited. The expansion orifice 34 is preferably prepared by the same approach as are the in-plane channels 70 and the via channels 72.

The use of a microforming technique such as laser micromachining offers important benefits in the manufacturing operation. The laser micromachining may be performed in a nearly fully automated fashion using computer numerically controlled equipment, reducing manufacturing costs. The laser micromachining produces highly reproducible, precise, finely scaled features, an important consideration in achieving the necessary precision stackability and continuous flow channels that are required for a small-diameter heat exchanger 60. In applications of interest, the cylindrical diameter of the heat exchanger 60 is less than 0.5 inches.

The insulator-seal-plate via channels 84 and axial channels 86 are preferably molded into the insulator-seal plate 82.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A gas-expansion cooler assembly having an assembly axis and comprising:
    an expansion plate having
        an expansion orifice therein, wherein the expansion orifice has an expansion-orifice inlet and an expansion-orifice outlet, and
        an expansion-plate axial channel extending through the expansion plate parallel to the assembly axis;
    an end plate in facing relation to a first side of the expansion plate, wherein the expansion plate and the end plate together define an expansion reservoir in fluid-flow communication with the expansion-orifice outlet and in fluid-flow communication with the expansion-plate axial channel; and
    a heat exchanger in facing relation to a second side of the expansion plate and having
        a heat-exchanger inlet, and
        a heat-exchanger outlet in fluid-flow communication with the expansion orifice inlet,
    wherein the heat exchanger comprises at least two heat-exchanger plates stacked in a facing relationship along the assembly axis, and wherein each heat-exchanger plate includes
        an in-plane channel lying substantially in a plane perpendicular to the assembly axis, wherein the in-plane channels in two adjacent heat-exchanger plates are in fluid-flow communication with each other, wherein an expansion-end heat-exchanger plate adjacent to the expansion plate has the in-plane channel in fluid-flow communication with the expansion-orifice inlet, and wherein an inlet-end heat-exchanger plate remote from the expansion plate has the in-plane channel in fluid-flow communication with the heat-exchanger inlet, whereby the in-plane channels of the heat-exchanger plates form a continuous high pressure fluid-flow path from the heat-exchanger inlet to the expansion-orifice inlet; and
        an axial channel extending parallel to the assembly axis, wherein the respective axial channels in two adjacent heat-exchanger plates are in fluid-flow communication with each other, and wherein the expansion-end heat-exchanger plate has the axial channel in fluid-flow communication with the expansion-plate axial channel, whereby the expansion reservoir and the axial channels in the expansion plate and the heat-exchanger plates form a continuous exhaust fluid-flow path from the expansion-orifice outlet to an exhaust port.

2. The gas-expansion cooler assembly of claim 1, wherein the in-plane channel is a spiral.

3. The gas-expansion cooler assembly of claim 1, wherein there is exactly one in-plane channel and a plurality of axial channels in each heat-exchanger plate.

4. The gas-expansion cooler assembly of claim 1, wherein the heat-exchanger plates are made of silicon.

5. The gas-expansion cooler assembly of claim 1, further including
    a cooled device in thermal contact with the end plate.

6. The gas-expansion cooler assembly of claim 1, further including
    a cooled device in thermal contact with the end plate, wherein the cooled device is formed in and is integral with the end plate.

7. The gas-expansion cooler assembly of claim 1, wherein all of the heat-exchanger plates are substantially identical in construction.

8. The gas-expansion cooler assembly of claim 1, further including
    an insulator-seal plate between each of the heat-exchanger plates and between the expansion-end heat-exchanger plate and the expansion plate.

9. The gas-expansion cooler assembly of claim 1, further including
    an insulator-seal plate between each of the heat-exchanger plates and between the expansion-end heat-exchanger plate and the expansion plate, wherein all of the insulator-seal plates are substantially identical in construction.

10. The gas-expansion cooler assembly of claim 1, further including
a polytetrafluoroethylene insulator-seal plate between each of the heat-exchanger plates and between the expansion-end heat-exchanger plate and the expansion plate.

11. The gas-expansion cooler assembly of claim 1, further including
an anti-plugging structure that prevents plugging of the expansion orifice by solid matter.

12. A gas-expansion cooler assembly having an assembly axis and comprising:
an expansion structure having
an expansion orifice with an expansion-orifice inlet and an expansion-orifice outlet, and
an expansion reservoir in fluid-flow communication with the expansion-orifice outlet; and
a heat exchanger having
a heat-exchanger inlet, and
a heat-exchanger outlet in fluid-flow communication with the expansion-orifice inlet,
wherein the heat exchanger comprises at least two heat-exchanger plates stacked in a facing relationship along the assembly axis, and wherein each heat-exchanger plate includes
an in-plane channel lying substantially in a plane perpendicular to the assembly axis, wherein the in-plane channels of the heat-exchanger plates are in fluid-flow communication with each other and with the expansion-orifice inlet to form a continuous high-pressure fluid-flow path from the heat-exchanger inlet to the expansion-orifice inlet; and
an axial channel extending parallel to the assembly axis, wherein the axial channels in adjacent heat-exchanger plates are respectively in fluid-flow communication with each other and with the expansion reservoir to form a continuous exhaust fluid-flow path from the expansion-orifice outlet to an exhaust port.

13. The gas-expansion cooler assembly of claim 12, wherein the heat exchanger is in facing relation to the expansion structure.

14. The gas-expansion cooler assembly of claim 12, wherein the in-plane channel is a spiral.

15. The gas-expansion cooler assembly of claim 12, wherein there is exactly one in-plane channel and a plurality of axial channels in each heat-exchanger plate.

16. The gas-expansion cooler assembly of claim 12, wherein the heat-exchanger plates are made of silicon.

17. The gas-expansion cooler assembly of claim 12, further including
a cooled device in thermal contact with the expansion structure.

18. The gas-expansion cooler assembly of claim 12, further including
a cooled device in thermal contact with the expansion structure, wherein the cooled device is formed in and is integral with the expansion structure.

19. The gas-expansion cooler assembly of claim 12, wherein all of the heat-exchanger plates are substantially identical in construction.

20. The gas-expansion cooler assembly of claim 12, further including
a insulator-seal plate between each of the heat-exchanger plates.

21. The gas-expansion cooler assembly of claim 12, further including
a polytetrafluoroethylene insulator-seal plate between each of the heat-exchanger plates.

22. A method for fabricating a gas-expansion cooler assembly, comprising the steps of
preparing an expansion plate having
an expansion orifice therein, wherein the expansion orifice has an expansion-orifice inlet and an expansion-orifice outlet, and
an expansion-plate axial channel extending through the expansion plate parallel to the assembly axis;
preparing an end plate, wherein the expansion plate and the end plate together define an expansion reservoir in fluid-flow communication with the expansion-orifice outlet and in fluid-flow communication with the expansion-plate axial channel; and
preparing a heat exchanger having
a heat-exchanger inlet, and
a heat-exchanger outlet in fluid-flow communication with the expansion orifice inlet,
wherein the heat exchanger comprises at least two heat-exchanger plates stacked in a facing relationship along the assembly axis, and wherein each heat-exchanger plate includes
an in-plane channel lying substantially in a plane perpendicular to the assembly axis, wherein the in-plane channels in two adjacent heat-exchanger plates are in fluid-flow communication with each other, wherein an expansion-end heat-exchanger plate adjacent to the expansion plate has the in-plane channel in fluid-flow communication with the expansion-orifice inlet, and wherein an inlet-end heat-exchanger plate remote from the expansion plate has the in-plane channel in fluid-flow communication with the heat-exchanger inlet, whereby the in-plane channels of the heat-exchanger plates form a continuous high-pressure fluid-flow path from the heat-exchanger inlet to the expansion-orifice inlet; and
an axial channel extending parallel to the assembly axis, wherein the axial channels in two adjacent heat-exchanger plates are respectively in fluid-flow communication with each other, and wherein the expansion-end heat-exchanger plate has the axial channel in fluid-flow communication with the expansion-plate axial channel, whereby the expansion reservoir and the axial channels in the expansion plate and the heat-exchanger plates form a continuous exhaust fluid-flow path from the expansion-orifice outlet to an exhaust port; and
assembling the gas-expansion cooler assembly by
assembling the end plate in facing relation to a first side of the expansion plate, and
assembling the heat exchanger in facing relation to a second side of the expansion plate.

23. The method of claim 22, wherein the step of preparing the heat exchanger includes the steps of
laser micromachining the in-plane channel into at least one of the heat-exchanger plates.

24. The method of claim 23, wherein the step of preparing the heat exchanger includes the steps of
providing the heat-exchanger plates made of silicon.

* * * * *